(12) United States Patent
Davis (10) Patent No.: US 7,705,693 B2
(45) Date of Patent: Apr. 27, 2010

(54) μ-FLAP TYPE NANO/MICRO MECHANICAL DEVICE AND FABRICATION METHOD THEREOF

(75) Inventor: Zachary James Davis, Glostrup (DK)

(73) Assignee: Seiko Epson Corporation (JP)

( * ) Notice: Subject to any disclaimer, the term of this patent is extended or adjusted under 35 U.S.C. 154(b) by 389 days.

(21) Appl. No.: 11/547,530

(22) PCT Filed: Apr. 6, 2005

(86) PCT No.: PCT/IB2005/000895

§ 371 (c)(1),
(2), (4) Date: Jun. 5, 2007

(87) PCT Pub. No.: WO2005/099087

PCT Pub. Date: Oct. 20, 2005

(65) Prior Publication Data

US 2007/0279140 A1    Dec. 6, 2007

(30) Foreign Application Priority Data

Apr. 6, 2004    (EP)    ................... 04076003

(51) Int. Cl.
*H03H 9/24* (2006.01)
(52) U.S. Cl. ..................................... 333/186
(58) Field of Classification Search .................. 333/186
See application file for complete search history.

(56) References Cited

U.S. PATENT DOCUMENTS 6,448,103 B1 * 9/2002 Thomas ........................ 438/52

(Continued)

FOREIGN PATENT DOCUMENTS

JP    08-102544    4/1996

(Continued)

OTHER PUBLICATIONS

Davis Z. J. et al.: 'Fabrication and characterization of nanoresonating devices for mass detection', Journal of Vacuum Science and Technology B: Microelectronics Processing and Phenomena, vol. 18, No. 2, March 2000, pp. 612-616, XP012008090.

(Continued)

*Primary Examiner*—Benny Lee
*Assistant Examiner*—Alan Wong
(74) *Attorney, Agent, or Firm*—Harness, Dickey & Pierce, P.L.C.

(57) ABSTRACT

A μ-flap type nano/micro mechanical device with a lower electrode 1, 1a, 1b, an upper electrode layer 2, an dielectric layer 3 arranged between the lower electrode 1, 1a, 1b and the upper layer 2, such that the dielectric layer 3 and said upper electrode layer 2 form a layered body 4, the layered body 4 comprising a horizontal recess 5 in a side portion of the dielectric layer 3, and an overhanging portion 6 of reduced thickness over the recess 5 that forms a gap 5a; such that the overhanging portion 6 forms a μ-flap 6a which extends over the gap 5a. The device is a capacitative-based device in which the mechanical motion can be measured at room temperature and without monolithic integration thereof with an integrated circuit but that can be easily integrated with complementary metal oxide semiconductor (CMOS) circuitry.

20 Claims, 8 Drawing Sheets

U.S. PATENT DOCUMENTS

| | | | |
|---|---|---|---|
| 6,744,335 B2 * | 6/2004 | Ryhanen et al. | 333/185 |
| 7,212,081 B2 * | 5/2007 | Tada et al | 333/186 |
| 2002/0044031 A1 * | 4/2002 | Takamine | 333/195 |
| 2004/0076008 A1 | 4/2004 | Ikeda | |
| 2004/0245587 A1 * | 12/2004 | Tada et al. | 257/414 |

FOREIGN PATENT DOCUMENTS

| | | |
|---|---|---|
| JP | 09-017300 | 1/1997 |
| JP | 10-290036 | 10/1998 |
| JP | 2003-124063 | 4/2003 |
| WO | WO-03/055788 A | 7/2003 |
| WO | WO 2004014784 A1 * | 2/2004 |

OTHER PUBLICATIONS

Davis Z. J., et al:, "Fabrication and Characterization of Nanoresonating Devices for Mass Detection", Journal of Vacuum Science & Technology B: Microelectronics Processing and Phenomena, American Vacuum Society, New York, NY, US, vol. 18, No. 2, Mar. 2000, pp. 612-616, XP012008090; ISSN: 0734-211X.

* cited by examiner

μ-FLAP TYPE NANO/MICRO MECHANICAL DEVICE AND FABRICATION METHOD THEREOF

TECHNICAL FIELD OF THE INVENTION

The present invention belongs to the technical field of integrated circuits and, more particularly, to high frequency mechanical resonators having dimensions in the nano/micrometer scale.

PRIOR ART TO THE INVENTION

In electronics, radiofrequency mechanical resonators have since some time ago been considered to be a suitable way to minimize size, power and cost, as well as to maximize functionality. Devices in the micro- and nano-meter scale having fundamental Eigen-frequencies in the MHz and GHz range have been developed for such purpose in recent years. By minimizing the size of such devices, the effective mass compared to the spring constant is substantially reduced, which increases the resonant frequency.

A main problem of scaling down the dimensions of such devices that is needed to reach the desired frequencies, has been the possibility of measuring the motion of the mechanical device, due to oscillation amplitudes in the nm to sub-nm range.

To overcome this problem it has been attempted to perform efficient readout by magnetomotive means wherein the resonator is excited by applying a large Lorentz force on a beam with an oscillating current running therethrough. Readout is then performed by measuring the electromotive force across the beam. This does however involve the disadvantages of requiring large magnetic fields and low current detection which both require helium temperatures (4.8K). Examples hereof are disclosed in Y. T. Yang et al.: "Monocrystalline Silicon Carbide Nanoelectromechanical Systems", Appl. Physics Letter 78(2), pp. 162-164 (2001) and in A. N. Cleland et al.: Fabrication of High-Frequency Nanometer Scale Mechanical Resonators From Bulk Si Crystals", Appl. Physics Letters 69(28), pp. 2653-2655 (1996).

Other attempts to improve read-out by using a capacitative readout scheme and without using low temperatures are disclosed for example in S. Pourkamali et al.: SOI-Based HF And VHF Single-Crystal Silicon Resonators With Sub-100 Nanometer Vertical Capacitative Gaps", Proceeding of Transducers '03, pp-837-840 (2003) and in Wang, Z. Ren et al.: "Self-Aligned 1.14 GHz Vibrating Radial-Mode Disk Resonators", Proceeding of Transducers '03, pp. 947-950 (2003). These attempts are based on measuring the mechanical motion by measuring the varying capacitance between the resonating mechanical structure and an anchored counter electrode. Whilst this allows to avoid the need of operating at low temperatures, until now only very low current signals have been measured and fabrication of these devices that are based on radial vibrating disk resonators, is very complex, so that it is difficult to integrate them with integrated circuits.

OBJECTS OF THE INVENTION

It is an object of the present invention to overcome the above-described drawbacks of prior art by providing a capacitative-based device having micro and nanometer scale dimensions, that is easy to manufacture and that can have resonant frequencies in the GHz range, and in which the current generated by the device is enhanced.

It is a further object of the present invention to provide a capacitative-based device in which the mechanical motion can be measured at room temperature and without monolithic integration thereof with an integrated circuit but that can be easily integrated with complementary metal oxide semiconductor (CMOS) circuitry.

Yet a further object of the invention is a process of manufacturing a capacitative-based device having the above characteristics.

Further objects and advantages of the present invention will become apparent from the following description.

DESCRIPTION OF THE INVENTION

The present invention achieves the aforementioned objects by μ-flap type nano/micro mechanical device comprising a lower electrode, an upper electrode layer having an upper layer thickness, an dielectric layer having an dielectric layer thickness arranged between the lower electrode and the upper layer, the dielectric layer and the upper electrode layer forming a layered body having a body width, a body length and a body thickness, wherein said layered body comprises a horizontal recess in a side portion of the dielectric layer, and an overhanging portion of the upper electrode layer over said recess. The recess forming a gap having a gap thickness; said overhanging portion forms a μ-flap which extends over said gap, the μ-flap having a μ-flap width, a μ-flap length and a μ-flap thickness; and said overhanging portion has a length defining the μ-flap length.

As used herein, the term 'μ-flap type nano/micro mechanical device' is a device comprising the above described μ-flap which, when fed with electric current, acts as a mechanical resonating structure, and the size of which is in the micro or even nanometer range.

In the device of the present invention, the lower electrode may be a conductive coating such as a layer of doped polysilicon which is especially suitable in respect of CMOS-compatibility, but also of materials such as doped poly-diamond, doped silicon carbide (SiC), preferably coated on a bottom substrate that may be of a dielectric or other material, or a doped substrate selected from of doped silicon, In general, it may be also of any conductive material such as metals. The upper electrode layer may be of any conductive material such as metals, doped polysilicon, doped bulk silicon, doped poly-diamond, doped silicon carbide (SiC) etc. On the other hand, the dielectric layer sandwiched between said lower electrode and said upper electrode layer is of a dielectric material such as a metal oxide as for example aluminum or germanium oxide, silicon oxide, etc. In general, materials being used in CMOS-technology and having other material constants can be used in the device of the present invention.

According to the invention, the μ-flap width may range from 0.1 μm to 1000 μm, the μ-flap length (fl) from 0.01 μm to 100 μm, and the μ-flap thickness from 0.001 μm to 10 μm. The body thickness may range from 0.01 μm to 100 μm. When the lower electrode is a coating, it may have a thickness ranging from 0.001 μm to 1000 μm.

In an embodiment of the device of the invention the lower electrode is a lower electrode layer arranged on a bottom substrate so that the gap is located between the lower electrode layer and the overhanging portion of the layered body forming the μ-flap that overhangs the gap. The gap thickness then corresponds to the distance between the overhanging portion forming the μ-flap, and the lower electrode layer which remains on the bottom substrate. In this case, the μ-flap thickness thus is, the body thickness of the layered body less the gap thickness.

In an alternative embodiment of the invention where the lower electrode is a lower electrode layer arranged on a bottom substrate, the lower electrode layer has been removed from the bottom substrate in all areas except below the dielectric layer, so that the gap is located between the bottom substrate and said overhanging portion of the layered body forming the μ-flap overhanging the gap. In this case, the gap thickness is the distance between the bottom substrate and the overhanging portion.

In a further embodiment of the device of the invention, the lower electrode is a doped substrate sheet so that the gap is located between the overhanging portion of the layered body and the doped substrate sheet. In this case, the gap thickness is the distance between the doped substrate sheet and the overhanging portion of the layered body forming the μ-flap. As long its doped region extends below under the μ-flap, the doped sheet can have a pattern that is different from the pattern of the upper electrode layer. Further, it is also possible to dope the silicon substrate at specific areas thereof.

The layered body may be comprised of a first body portion from which the μ-flap extends horizontally, and a second body portion adjacent to the first portion in which case the first body portion has a width being equal to the μ-flap width. The second body portion of the layered body may have a width that is smaller than the μ-flap width such that the μ-flap protrudes laterally over one or both sides of said second body portion, such that the layered body including the μ-flap is, in a top plan view, substantially L- or T-shaped. When the lower electrode is a lower electrode layer such as a layer of doped polysilicon, the lower electrode layer may be arranged on the bottom substrate below said first body portion but substantially not below said second body portion.

As apparent, in the device of the present invention, the μ-flap is a resonating structure having a μ-flap width, a μ-flap length and a μ-flap thickness. When taking into account the equations for resonant frequency of a single clamped beam, $$f \propto \frac{t}{l^2} (Hz)$$

wherein t is the μ-flap thickness, and l is the μ-flap length, it becomes further apparent that the resonant frequency is not dependent on the width of flap but on its length, thickness and material constant.

Still further, the spring constant of such structure is linearly dependent on the flap width as evidence by the following equation:

$$K \propto \frac{t^3}{l^3} w (N/m)$$

wherein t is the μ-flap thickness, l is the μ-flap length and w is the μ-flap width.

By increasing the width, the static capacitance between the μ-flap and the bottom substrate is increased without the resonant frequency being affected thereby. As the spring constant is also increased, the Q-factor in air will also become enhanced which is in accordance with the teachings in S. Pourkamali et al.: SOI-Based HF And VHF Single-Crystal Silicon Resonators With Sub-100 Nanometer Vertical Capacitive Gaps", Proceeding of Transducers '03, pp-837-840 (2003) and in Wang, Z. Ren et al.: "Self-Aligned 1.14 GHz Vibrating Radial-Mode Disk Resonators", Proceeding of Transducers '03, pp. 947-950 (2003). It should be further noted that even though the spring constant increases with increasing width, in view that the electrostatic forces are also linearly dependent on the μ-flap width, the operating voltages required to vibrate the μ-flap are not increased.

In connection herewith, it should be noted that, as vibration of the device of the present invention is vertical instead of lateral, the structure of the side walls of the device is not crucial, this being contrary to conventional radial and lateral resonators.

In view of the aforestated facts, in the device of the present invention, static capacitance between a high frequency resonator and a static electrode is increased, especially with gap-thicknesses below 100 nm. Capacitative perturbation is thus sufficient to be measured without a need of minimizing capacitances in the system. Furthermore, the simplicity of the device allows easy integration with CMOS circuitry without add-on layer and is obtainable by only very few processing steps. The device of the present invention is thus particularly suitable for high Q-factor mechanical resonators being fully integrated with CMOS, whereby the design platform can also be used to integrate other micro-electromechanical systems (MEMS) with CMOS to thereby obtain faster, less expensive and more functional electrical and mechanical components for electronics.

The afore described μ-flap type nano/micro mechanical can be manufactured by a simple method comprising a first step of providing an dielectric layer material onto at least a partial area of a lower electrode material, a second step of depositing an upper electrode layer material onto said dielectric layer material, and a third step of patterning at least the upper electrode layer material and the dielectric layer material into a desired pattern. In accordance with the method of the present invention, said third step comprises patterning the upper electrode layer material into a final shape of the upper electrode, bringing the dielectric layer material into an intermediate shape that substantially corresponds to the final shape of the upper electrode layer, and removing oxide material from at least one side portion of the dielectric layer material located over said partial area of the lower electrode material to provide the horizontal recess in the at least one side portion of the dielectric layer material whereby said layered body is formed. Thereby, the layered body is made to comprise the overhanging portion of the upper electrode layer protruding over the recess and the gap between the overhanging portion an the partial area of the lower electrode material where the oxide material has been removed. Thus, said partial area of the lower electrode material becomes at least said part of the lower electrode located below said gap, and the overhanging portion forms the μ-flap.

In an embodiment of the invention that is compatible with CMOS-technology, the lower electrode is preferably a layer, such as a film, of doped polysilicon or doped silicon, or a sheet of doped silicon, the dielectric layer is preferably of silicon oxide or germanium oxide, and the upper electrode is preferably another layer of doped polysilicon.

When the lower electrode is a lower electrode layer said layer is arranged on a bottom substrate that can be of a dielectric material such as silicon oxide or a silicon substrate. Such lower electrode layer may be of doped polysilicon in which case the polysilicon is first deposited on the bottom substrate, for example by LPCVD ('Low Pressure Chemical Vapor Depositions) and doped by using per se conventional techniques to ensure conductivity. The lower electrode layer may also be a layer of doped silicon. Such layer of doped silicon may be obtained, for example, by doping a top portion of the bottom substrate when said bottom substrate is of silicon, to ensure conductivity. When a specific shape of the polysilicon lower electrode is to be achieved, the polysilicon lower electrode may be subjected to standard UV lithography techniques and etching techniques such as those that are common in CMOS technology.

The dielectric layer, when for example of silicon oxide, may be deposited by per se conventional techniques or grown. Deposition of the dielectric layer material may be carried out, for example, by using thermal oxidation technique. This technique has the advantage that the thickness of the dielectric layer can be controlled in a very precise manner.

The upper electrode layer may also be of doped polysilicon that has been conventionally deposited by conventional techniques and then doped by using per se conventional techniques to ensure conductivity. Patterning of the polysilicon upper electrode layer material can then be achieved for example by subjecting said material to standard UV lithography techniques and dry anisotropic silicon etching such as those that common in CMOS technology. Anisotropic etching has the advantage that it does not affect the silicon oxide of the dielectric layer material.

The horizontal recess in the dielectric layer material can be carried out by conventional isotropic wet chemical etching. Due to the isotropic nature of the wet etching, it does not affect the polysilicon of the lower and the upper electrode layers and the overhanging portion of the upper electrode forming the µ-flap, is released in a very simple and precise manner in view that the upper electrode layer is under-etched. The length of the µ-flap is determined by the amount of etching of the oxide and can thus be controlled very accurately with nanometer precision.

As stated above, this embodiment of the µ-flap device and of the process of manufacture thereof, is compatible with CMOS, and it is a batch process by which high yield can be easily obtained.

BRIEF DESCRIPTION OF THE DRAWINGS

So as to contribute to the understanding of the present invention, appended hereto are a number of drawings which are part of the present specification. In these drawings

In these figures, there appear reference numbers and letters that have the following meanings:

1 lower electrode
1a,1b lower electrode layer
1b' doped lower electrode layer coating
2 upper electrode layer
2' upper electrode layer material
3 dielectric layer
3' dielectric layer material
4 layered body
4a first body portion
4b a second body portion
5 horizontal recess
5a gap
6 overhanging portion
6a µ-flap
7 bottom substrate
8 silicon substrate
A layered structure
B layered structure
C layered structure
bl body length
bl' length of second body portion
bl" length of first body portion
bt body thickness
bw body width
fl µ-flap length
ft µ-flap thickness
fw µ-flap width
gt gap thickness
lt lower electrode thickness
ot dielectric layer thickness
ut upper layer thickness

DESCRIPTION OF EMBODIMENTS OF THE INVENTION

Figure 1:
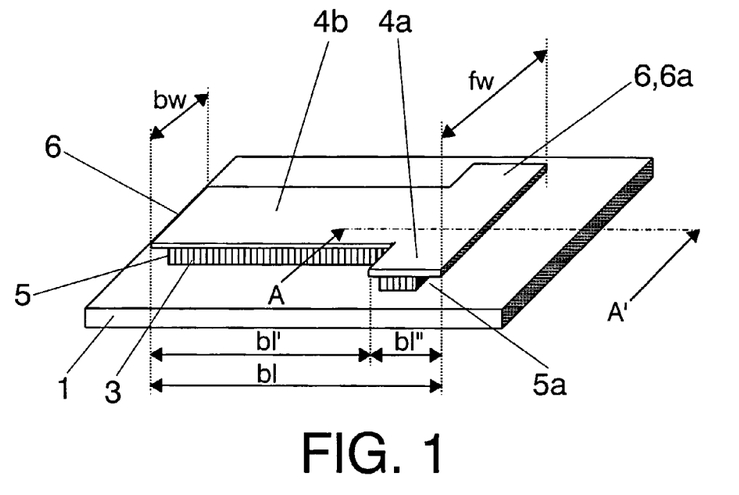
FIG. 1 is a lateral perspective view that schematically shows the device of the present invention in accordance with a first embodiment.
Figure 2:
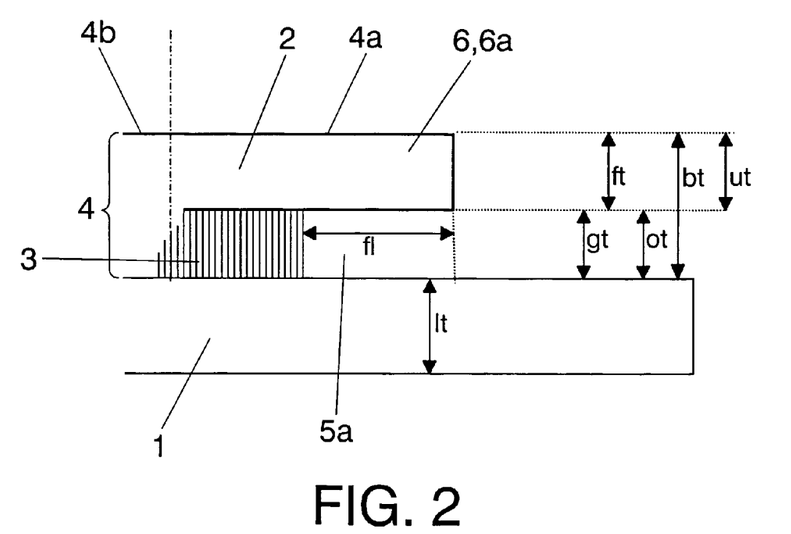
FIG. 2 is a cross sectional view along line A-A' of the device shown in FIG. 1.

FIGS. 1 and 2 schematically show a first embodiment of a device according to the invention. As apparent, in this embodiment the device comprises an dielectric layer 3 sandwiched between a lower electrode 1 having a thickness it and an upper electrode layer 2 having a thickness ut. In this embodiment, the lower electrode 1 is a substrate sheet 1 of doped bulk silicon. In addition to the specific shape of the sheet shown in this figure, the doped sheet can be of any shape as long as it extends below the µ-flap 6a.

The dielectric layer 3 and the upper electrode layer 2 form a layered body 4 having a body length bl, a body thickness bt and a body width bw.

The layered body 4 comprises a horizontal recess 5 in a side portion of the dielectric layer 3, and an overhanging portion 6 of the upper electrode layer 2 over a gap 5a having a gap thickness gt. The said overhanging portion 6 forms the µ-flap 6a which extends over the gap 5a. The layered body 4 comprises a first body portion 4a having body length bl" from which the μ-flap 6*a* extends horizontally and has a width that is equal to the μ-flap width fw. Adjacent to said first body portion 4*a* is a second body portion 4*b* with a length bl' which has a width bw being smaller than the μ-flap width fw such that the first body portion 4*a* and the μ-flap 6*a* protrude laterally over both sides of said second body portion 4*b*.

The μ-flap 6*a* has a μ-flap width fw, a μ-flap length fl and a μ-flap thickness ft. The gap thickness gt is the distance between said doped substrate sheet 1 and said overhanging portion 6 of the upper electrode 2 forming the μ-flap 6*a*. Therefore, the flap thickness ft is the thickness bt of the layered body 4 less the gap thickness gt.

The resonant frequency of the resonating structure formed by the μ-flap 6*a* is, in view of the equations referred to herein above, not dependent on the width fw of flap but on its length fl, thickness ft and material constant, and the spring constant of such a structure is linearly dependent on the flap width fw. Therefore, by increasing the width, the static capacitance between the μ-flap and the bottom substrate is increased without the resonant frequency being affected thereby and, as the spring constant is also increased, acoustic damping will be decreased. This leads to the static capacitance between a high frequency resonator and a static electrode being increased, so that capacitative perturbation is sufficient to be measured without a need of minimizing capacitances in the system.

Figure 3:
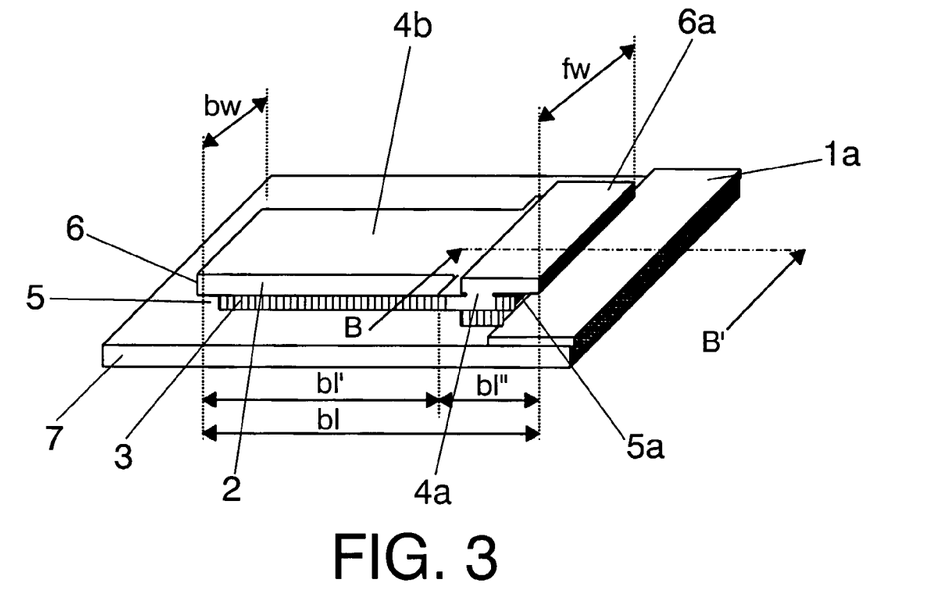
FIG. 3 is a lateral perspective view that schematically shows the device of the present invention in accordance with a second embodiment.
Figure 4:
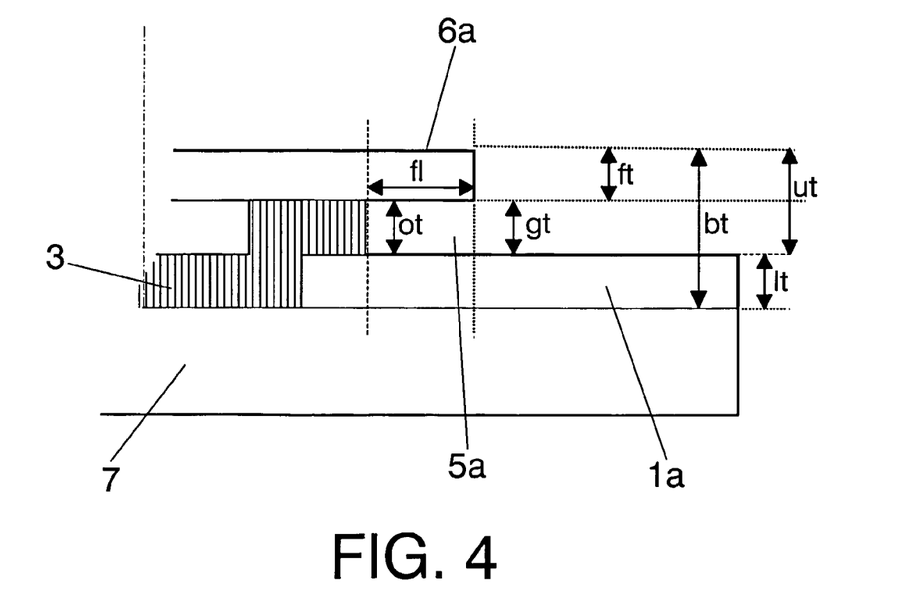
FIG. 4 is a cross sectional view along line B-B' of the device shown in FIG. 3.

FIGS. 3 and 4 show an embodiment in which the structure and dimensions of the layered body 4 and of the μ-flap 6*a* are the same as those of the first embodiment shown in FIGS. 1 and 2, but wherein the lower electrode 1 is a lower electrode layer 1*a* coated on a bottom substrate 7 only below the μ-flap 6*a* from which it extends to the outer rim of the substrate sheet 7. The lower electrode layer 1*a* may be a film of doped polysilicon.

In this second embodiment, the gap thickness gt is the distance between the lower electrode layer 1*a* and the overhanging portion 6 i.e. the body thickness bt less the thickness of the lower layer lt less the μ-flap thickness ft.

Figure 5:
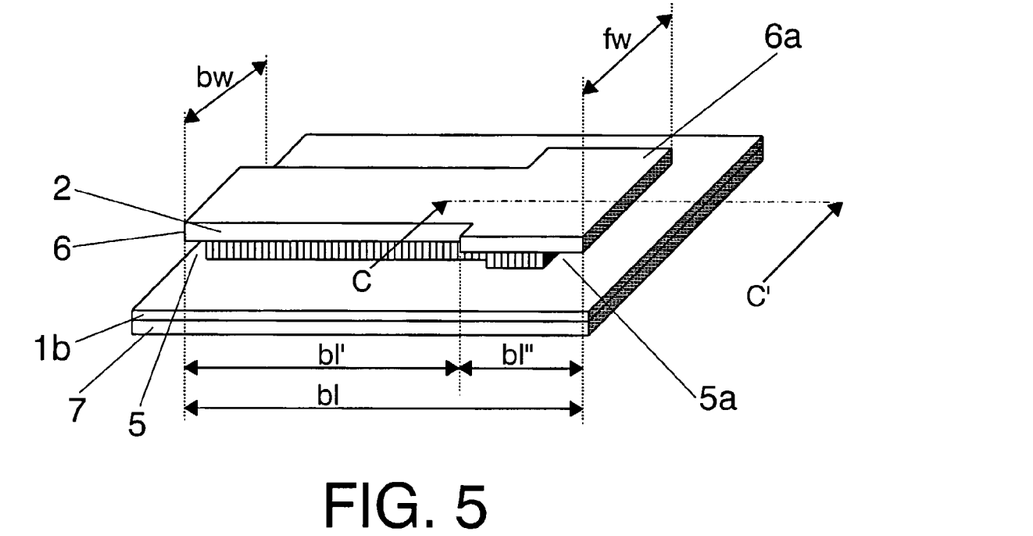
FIG. 5 is a lateral perspective view that schematically shows the device of the present invention in accordance with a third embodiment.
Figure 6:
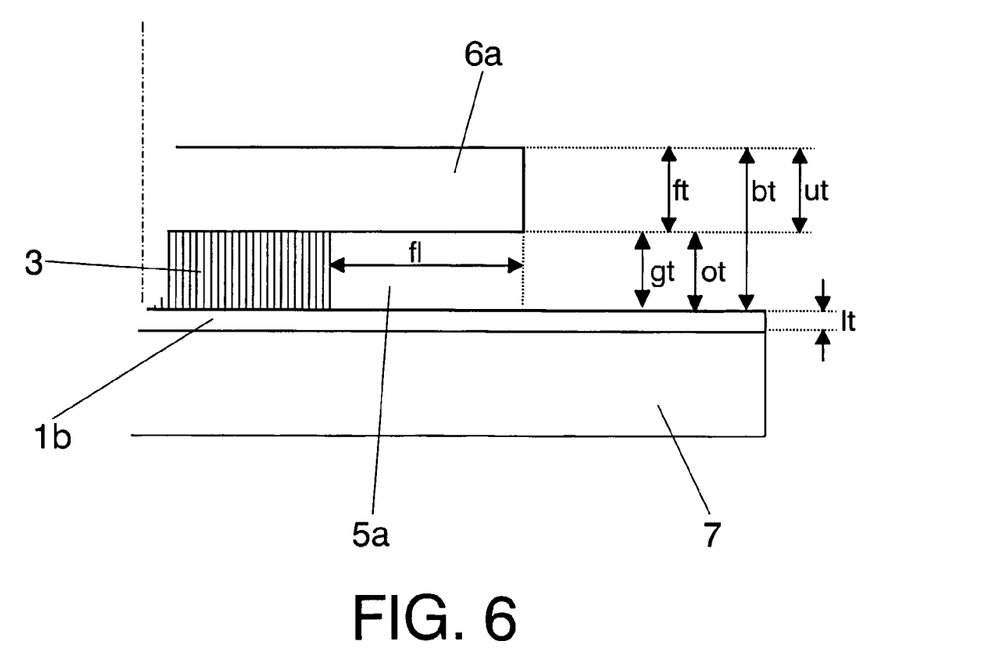
FIG. 6 is a cross sectional view along line C-C' of the device shown in FIG. 5.

The third embodiment of the device of the present invention shown in FIGS. 5 and 6 is the same as that in FIGS. 1 and 2, except that the lower electrode is a lower electrode layer 1*b* obtained by doping the top portion of a substrate sheet 7 of silicon. The lower electrode layer 1*b* extends over the whole upper surface of the doped silicon lower electrode layer of the bottom substrate 7. The dimensions and structure of the layered body 4 and the gap thickness gt are the same as those of the device shown in FIGS. 1 and 2. Also, instead of the specific shape of the sheet shown in this figure, the doped sheet can be of any shape as long as it extends below the μ-flap 6*a*.

Figure 7:
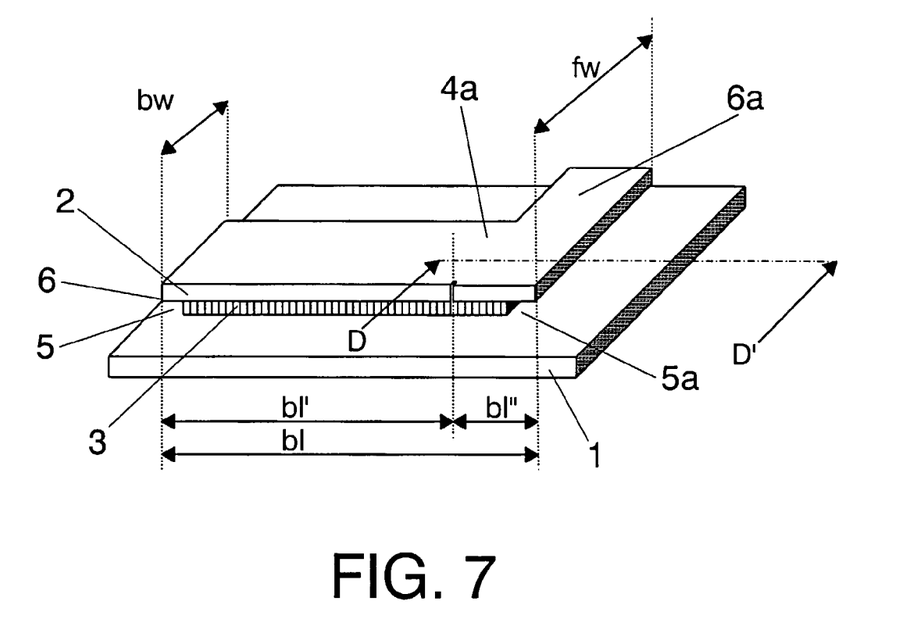
FIG. 7 is a lateral perspective view that schematically shows the device of the present invention in accordance with a fourth embodiment.
Figure 8:
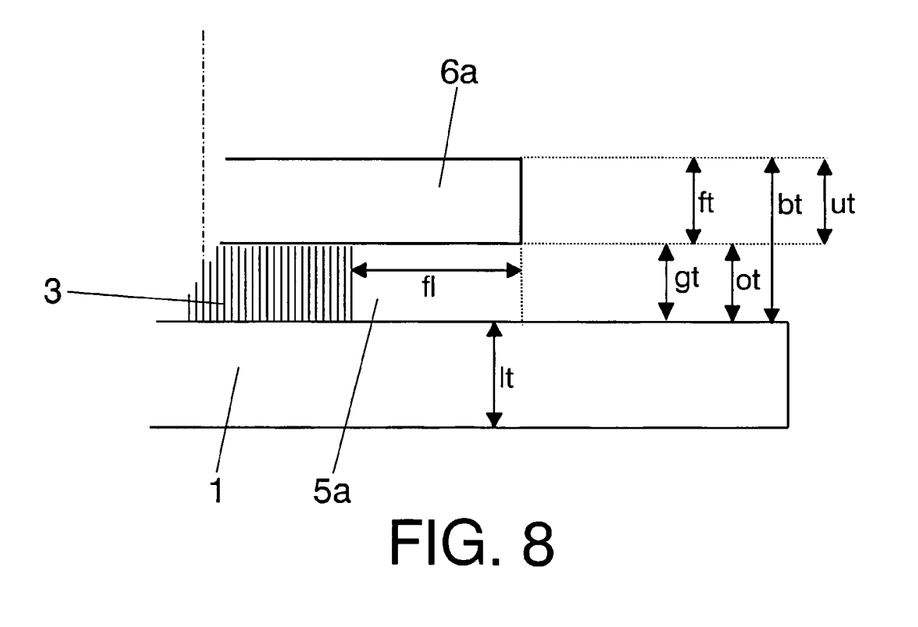
FIG. 8 is a cross sectional view along line D-D' of the device shown in FIG. 7.

FIGS. 7 and 8 illustrate a fourth embodiment which in which the basic structure and dimensions are the same as those of the device shown in FIGS. 1 and 2, except that the first body portion 4*a* of the layered body 4 and thus the μ-flap 6*a* only protrude over one side portion of the second body portion 4*b* so that the device is L-shaped instead of T-shaped as the device shown in FIGS. 1 and 2.

Figure 9A:
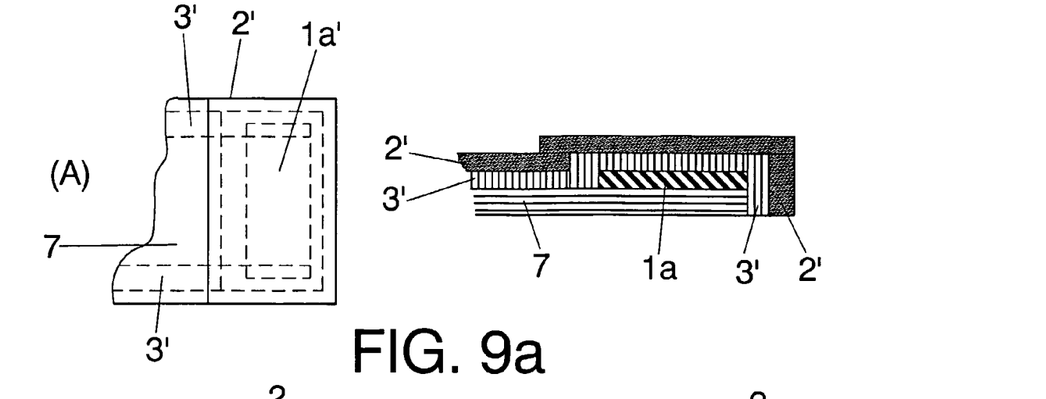
FIGS. 9a, 9b, 9c, 9d schematically show how, in accordance with the manufacturing method of the present invention the device shown in FIG. 3 is patterned starting from a layered structure.

FIGS. 9*a*-9*d* show an example on how the device corresponding to the embodiment shown in FIGS. 3 and 4 is obtained from a layered structure A that is shown in FIG. 9*a* and which comprises a doped lower electrode layer 1*a*' (as for example doped polysilicon) deposited on a bottom substrate 7, an dielectric layer material 3' (as for example silicon oxide) and an upper layer material 2' (as for example doped polysilicon). The layered structure A has been prepared by a first method step wherein the doped lower electrode layer 1*a*' has been deposited on the bottom substrate 7 by LPCVD, doped and patterned by standard UV-lithography, and the dielectric layer material 3' has been deposited by thermal oxidation on both, the substrate 7 and the doped lower electrode layer 1*a*', and a second method step wherein the upper electrode layer material 2' has been coated on the dielectric layer material 3' and doped.

Figure 9B:
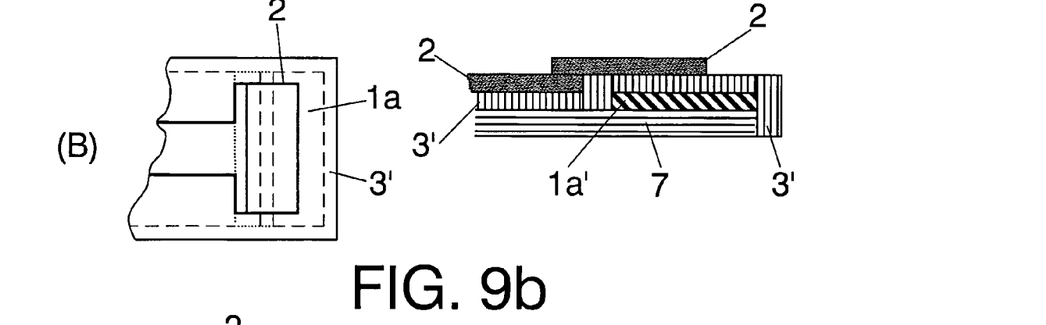

After patterning the upper layer material 2' by UV-lithography and dry anisotropic silicon etching into the final T-shape of the upper electrode layer 2 of the device of FIGS. 3 and 4, the layered structure B shown in FIG. 9*b* is obtained. Thereafter, the dielectric layer material 3' is patterned by standard wet chemical isotropic etching into the same T-shape as the upper electrode layer 2, and the layered structure C shown in FIG. 9*c* is obtained.

Figure 9C:
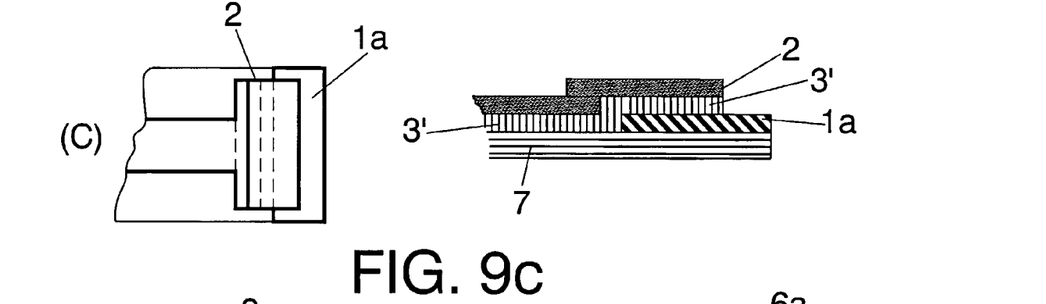
Figure 9D:
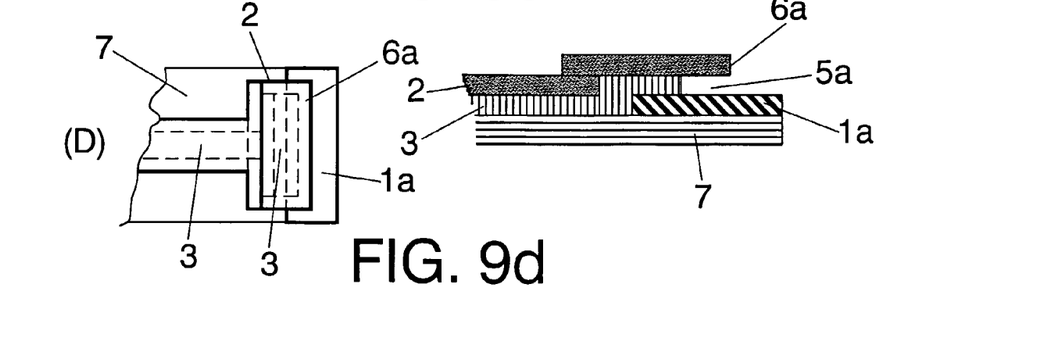

In the layered structure C shown in FIG. 9*c* the overhanging portion 5 and thereby the μ-flap 6*a* are then formed by removing the side portions of the dielectric layer material 3' by further wet chemical isotropic etching so as to provide a horizontal recess 5 in the side portion of the dielectric layer 3'. Thereby, as shown in FIG. 9*d*, over said recess 5 an overhanging portion 6 is formed and the lower electrode layer 1*a* becomes freed from the oxide material and gap 5*a* is formed there, i.e. the μ-flap 6*a* comprised of the upper electrode layer 2 is released.

Figure 10:
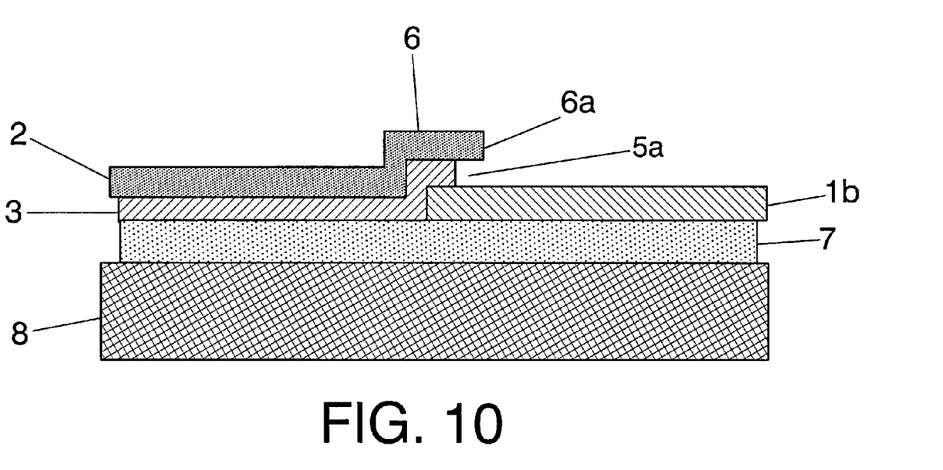
FIG. 10 schematically shows a fifth embodiment of the device of the present invention.

FIG. 10 shows a fifth embodiment of the μ-flap type device of the present invention which comprises an dielectric layer 3 of thermal oxide deposited on an area of a bottom substrate 7 and a lower electrode 1*b* of a doped polysilicon deposited on a neighboring area of the substrate 7. The bottom substrate 7 is arranged on a lower silicon substrate 8.

An upper electrode layer 2 of doped polysilicon extends on the dielectric layer 3 and on a contiguous portion of the lower electrode layer 1*b*. In the vicinity of said contiguous portion of the lower electrode layer 1*b*, there is a portion of the upper electrode layer 2 that emerges from the top surface of the upper electrode layer 2 and that comprises an overhanging portion 6 that constitutes the μ-flap 6*a* that protrudes horizontally over the an area of the lower electrode layer 1*b* such that a gap 5*a* is present between the μ-flap and the lower electrode layer 1*b*.

Figures 11A, 11B, 11C, 11D:
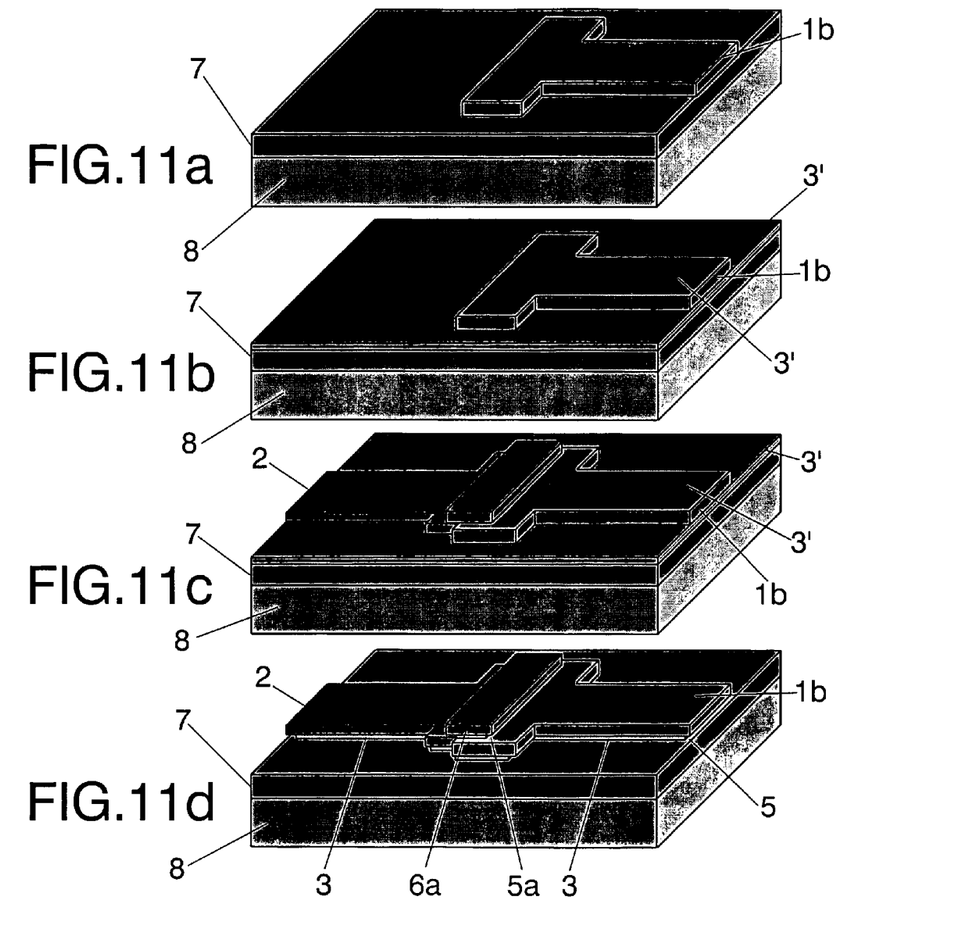
FIGS. 11a, 11b, 11c, 11d schematically show how, in accordance with the manufacturing method of the present invention the device shown in FIG. 10 is patterned starting from a layered structure.

FIG. 9*a* to 9*d* schematically illustrate the steps of manufacturing the device of FIG. 10. These steps are basically as follows:

First, the dielectric silicon dielectric layer 7 is deposited on the silicon substrate 8. Then, a layer of polysilicon is deposited on the surface of the dielectric layer 7, doped to ensure conductivity and patterned by UV-lithography into the final shape of the lower electrode layer 1*b*. The resulting layered structure is shown in FIG. 11*a*. Second, a dielectric layer material 3' is deposited on the layered structure shown in FIG. 11*a* to cover the whole top surface thereof. The resulting structure in which the lower electrode layer 1*b* is also covered by the dielectric layer material 3' is shown in FIG. 11*b*.

Third, an upper layer of polysilicon is deposited on the whole top surface of the structure shown in FIG. 11*b*, doped to ensure conductivity and patterned by UV-lithography into the final shape of the upper electrode 2, whereby the structure shown in FIG. 11*c* is obtained. As described herein above, patterning by UV-lithography does not affect the thermal oxide. As apparent from FIG. 11*c*, the dielectric layer material 3' covers the lower electrode 1*b* as well as the top surface of the bottom substrate 7.

The structure shown in FIG. 11*c* is then subjected to wet chemical etch whereby the dielectric layer material 3' is removed from the top surface of the bottom substrate 7 and from the top surface of the lower electrode layer 1*b*. Further, the side portions of the thermal silicon oxide layer material 3' below the upper and lower electrode layers (2,1*b*) become under-etched so that gap 5*a* between the electrode layers 1*b*,2 is formed and the μ-flap 6*a* overhanging the gap 5*a* becomes released. As already described herein above, chemical isotropic etch of the dielectric layer 3 does not affect the polysilicon layers. The resulting structure that corresponds to the fifth embodiment shown in FIG. 10, is illustrated in FIG. 11*d*.

According to this fifth embodiment, the lower electrode layer 1*b* and the bottom substrate 7 may in turn constitute elements of a subsequently connected μ-flap type device (not shown in FIG. 10) as that shown in FIG. 10 or in any of FIGS. 1, 3, 5 and 7. Thus, in such a subsequently connected μ-flap type device, the bottom substrate 7 shown in FIG. 10 being of a dielectric oxide material, may be used as an dielectric layer, whilst the lower electrode layer 1*b* may be used as an upper electrode layer. This implies that the μ-flap type device of the present invention may be easily interconnected with other such devices in CMOS technology In order to determine the performance of device having the structure shown in FIGS. 3 and 4, device characteristics for various different dimensions have been calculated and the electrical characteristics have been modeled using an equivalent lumped model as described in Abadal, G. et al.: "Electromechanical Model of a Resonating Nano-Cantilever-Based Sensor for High-Resolution And High-Sensivity Mass Detection", Nanotechnology 12, pp. 100-104 (2001). In table 1 the stiffness, resonant frequency and the snap-in voltage are calculated for a μ-flap with widths varying from 1 micron to 100 micron have been calculated. The snap-in voltage is the voltage needed for the μ-flap to collapse into the parallel electrode and is an indication of the voltage operation range. In these calculations, a gap distance of 20 nm is being used. This value is a similar value to CMOS oxide thickness in CMOS processes.

TABLE 1

| μ-flap width fw | μ-flap thickness ft (m) | μ-flap length fl (m) | k (N/m) | f(Hz) | Vsnap (V) |
|---|---|---|---|---|---|
| 1.00E−06 | 3.80E−07 | 1.006E−06 | 2194.88 | 5.09E+08 | 41.78 |
| 1.00E−05 | 3.80E−07 | 1.006E−06 | 2.19E+04 | 5.09E+08 | 41.78 |
| 5.00E−05 | 3.80E−07 | 1.006E−06 | 1.10E+05 | 5.09E+08 | 41.78 |
| 1.00E−04 | 3.80E−07 | 1.006E−06 | 2.19E+05 | 5.09E+08 | 41.78 |

As readily apparent from table 1, the snap-in voltage is constant even when stiffness is increased by several orders of magnitude.

Figure 12:
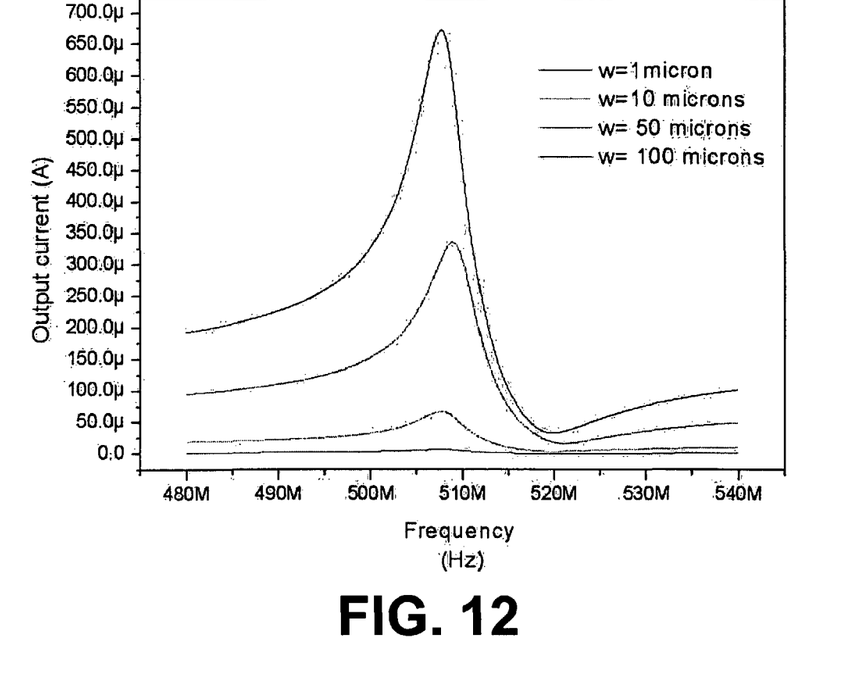
FIG. 12 is a graph showing output currents versus AC driving frequencies of µ-flaps with varying widths without parasitic capacitances.

SPICE modeling of the output current versus the AC driving frequency is shown in FIG. 12. The results are determined by using a Q-factor of 100 which, according to Davis, Z. J. et al.: "Fabrication And Characterization of Nano-Resonating Devices for Mass Detection", J. Vac. Technol. B, 18(2), pp 612-616 (2000), is a typical value of polysilicon resonators in air, and an AC and DC voltage of 1V and 10V, respectively. FIG. 12 shows that the output current of the device increases from about 5 μA where the width is 1 μm, and several hundred μA where the width is 100 μm.

Figure 13:
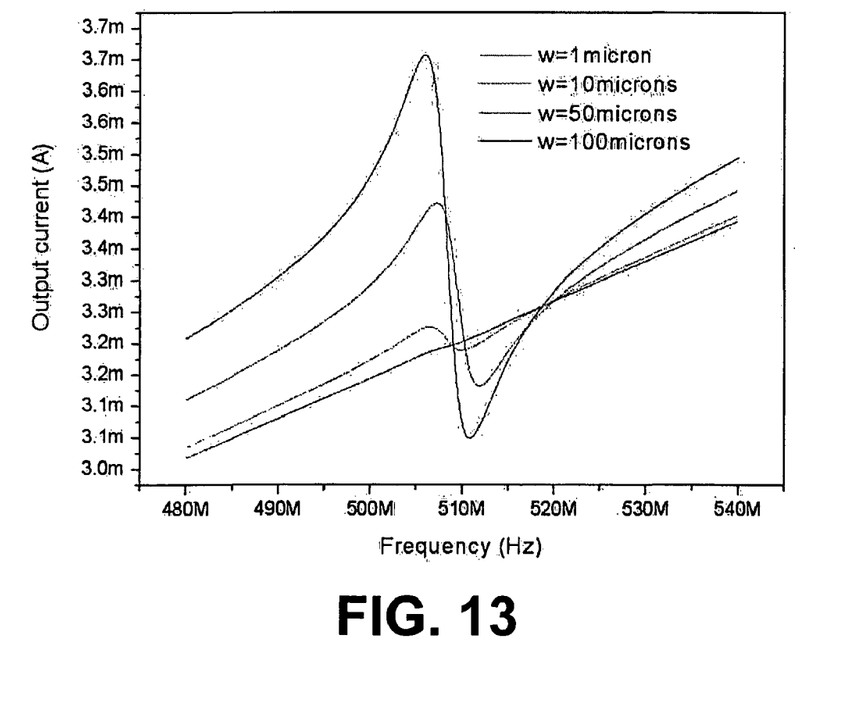
FIG. 13 is a graph showing output currents versus AC driving frequencies of µ-flaps with varying widths with 1 pF of parasitic capacitances.

In the simulations corresponding to FIG. 12, the parasitic capacitance is not included although in a real system parasitic capacitance in the system is very large i.e. about 1 pF. Therefore, the devices have also been modeled in the presence of 1 pF parasitic capacitance, and the results hereof are shown in FIG. 13. FIG. 13 evidences that for a device having a μ-flap width of 1 μm, the signal is almost completely drowned out by the parasitic current, whereas for a device having a μ-flap having larger widths, the signal is larger than the parasitic signal.

The invention claimed is:

1. A μ-flap type nano/micro mechanical device comprising:
a lower electrode of a first conductive material,
an upper electrode layer of a second conductive material having an upper layer thickness,
a dielectric layer of a dielectric material having a dielectric layer thickness arranged under and in contact with said upper electrode layer,
said dielectric layer and said upper electrode layer forming a layered body having a body width, a body length and a body thickness,
wherein
said layered body comprises a horizontal recess in a side portion of the dielectric layer, and an overhanging portion of said upper electrode layer over said recess,
at least a part of the lower electrode is located below at least a lateral part of said overhanging portion such that the recess forms a gap between said overhanging portion and said part of the lower electrode having a gap thickness;
over said gap, said lateral part of the overhanging portion forms a resonant μ-flap having a μ-flap width, a μ-flap thickness; and a μ-flap length;
said lower electrode is a lower electrode layer having a lower electrode thickness;
said lower electrode layer is arranged on a bottom substrate;
said gap is located between said lower electrode layer and said μ-flap of said layered body;
said gap thickness corresponds to the distance between said overhanging portion forming the μ-flap, and said lower electrode layer; and
said lower electrode layer extends over the whole surface of the bottom substrate.

2. A μ-flap type nano/micro mechanical device comprising:
a lower electrode of a first conductive material,
an upper electrode layer of a second conductive material having an upper layer thickness,
a dielectric layer of a dielectric material having a dielectric layer thickness arranged under and in contact with said upper electrode layer,
said dielectric layer and said upper electrode layer forming a layered body having a body width, a body length and a body thickness,
wherein
said layered body comprises a horizontal recess in a side portion of the dielectric layer, and an overhanging portion of said upper electrode layer over said recess,
at least a part of the lower electrode is located below at least a lateral part of said overhanging portion such that the recess forms a gap between said overhanging portion and said cart of the lower electrode having a gap thickness;
over said gap, said lateral part of the overhanging portion forms a resonant μ-flap having a μ-flap width, a μ-flap thickness; and a μ-flap length; and
said layered body comprises a first body portion from which the p-flap extends horizontally, and a second body portion adjacent to said first body portion, the first body portion having a width being equal to the μ-flap width.

3. A device according to claim 2, wherein
said lower electrode is a doped substrate sheet;
said gap is located between said μ-flap and said doped substrate sheet; and
said gap thickness is the distance between said doped substrate sheet and the μ-flap of said layered body.

4. A device according to claim 2, wherein the second body portion of the layered body has a width being smaller than the μ-flap width.

5. A device according to claim 2, wherein the μ-flap width is such that the first body portion and the μ-flap protrudes laterally over both sides of said second body portion.

6. A device according to claim 2, wherein said μ-flap width is from 0.1 to 1000 μm.

7. A device according to claim 2, wherein said μ-flap length is from 0.01 to 100 μm.

8. A device according to claim 2, wherein said μ-flap thickness is from 0.01 to 100 μm.

9. A device according to claim 2, wherein said gap thickness is from 0.001 to 10 μm.

10. A device according to claim 2, wherein said body thickness is from 0.01 to 100 μm.

11. A device according to claim 2, wherein said lower electrode thickness is from 0.001 to 1000 μm.

12. A device according to claim 2, wherein said lower electrode is of doped polysilicon.

13. A device according to claim 2, wherein said lower electrode is selected from the group consisting of metals and alloys thereof.

14. A device according to claim 2, wherein said dielectric layer is of a dielectric material selected from metal oxides.

15. A device according to claim 2, wherein said dielectric layer is one of aluminum oxide and germanium oxide.

16. A device according to claim 2, wherein said dielectric layer is of silicon oxide.

17. A device according to claim 2, wherein said upper electrode layer is of one of doped bulk silicon, doped silicon, doped silicon carbide, doped poly-diamond and doped polysilicon.

18. A device according to claim 2, wherein said upper electrode layer is of a metal.

19. A μ-flap type nano/micro mechanical device comprising:
   a lower electrode of a first conductive material,
   an upper electrode layer of a second conductive material having an upper layer thickness,
   a dielectric layer of a dielectric material having a dielectric layer thickness arranged under and in contact with said upper electrode layer,
   said dielectric layer and said upper electrode layer forming a layered body having a body width, a body length and a body thickness,
   wherein
   said layered body comprises a horizontal recess in a side portion of the dielectric layer, and an overhanging portion of said upper electrode layer over said recess,
   at least a part of the lower electrode is located below at least a lateral part of said overhanging portion such that the recess forms a gap between said overhanging portion and said part of the lower electrode having a gap thickness;
   over said gap, said lateral part of the overhanging portion forms a resonant μ-flap having a μ-flap width, a μ-flap thickness; and a μ-flap length;
   said lower electrode is a lower electrode layer having a lower electrode thickness;
   said lower electrode layer is arranged on a bottom substrate;
   said gap is located between said lower electrode layer and said μ-flap of said layered body;
   said gap thickness corresponds to the distance between said overhanging portion forming the μ-flap, and said lower electrode layer; and
   said layered body comprises a first body portion from which the μ-flap extends horizontally, and a second body portion adjacent to said first body portion, the first body portion having a width being equal to the μ-flap width, and wherein said lower electrode layer is arranged on said bottom substrate below said first body portion but substantially not below said second body portion.

20. A μ-flap type nano/micro mechanical device comprising:
   a lower electrode of a first conductive material,
   an upper electrode layer of a second conductive material having an upper layer thickness,
   a dielectric layer of a dielectric material having a dielectric layer thickness arranged under and in contact with said upper electrode layer,
   said dielectric layer and said upper electrode layer forming a layered body having a body width, a body length and a body thickness,
   wherein
   said layered body comprises a horizontal recess in a side portion of the dielectric layer, and an overhanging portion of said upper electrode layer over said recess,
   at least a part of the lower electrode is located below at least a lateral part of said overhanging portion such that the recess forms a gag between said overhanging portion and said part of the lower electrode having a gag thickness;
   over said gap, said lateral part of the overhanging portion forms a resonant μ-flap having a μ-flap width, a μ-flap thickness; and a μ-flap length; and
   said lower electrode is of doped bulk silicon.

* * * * *